(12) United States Patent
Jonishi et al.

(10) Patent No.: US 9,513,381 B2
(45) Date of Patent: Dec. 6, 2016

(54) SCINTILLATOR PANEL AND RADIATION DETECTOR

(71) Applicant: HAMAMATSU PHOTONICS K.K., Hamamatsu-shi, Shizuoka (JP)

(72) Inventors: Hidenori Jonishi, Hamamatsu (JP); Munenori Shikida, Hamamatsu (JP); Yutaka Kusuyama, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 14/414,775

(22) PCT Filed: Apr. 18, 2013

(86) PCT No.: PCT/JP2013/061514
§ 371 (c)(1),
(2) Date: Jan. 14, 2015

(87) PCT Pub. No.: WO2014/013772
PCT Pub. Date: Jan. 23, 2014

(65) Prior Publication Data
US 2015/0168568 A1  Jun. 18, 2015

(30) Foreign Application Priority Data

Jul. 20, 2012 (JP) ................................. 2012-161787

(51) Int. Cl.
*G01T 1/20* (2006.01)
*H01L 27/146* (2006.01)
(Continued)

(52) U.S. Cl.
CPC ............. *G01T 1/2018* (2013.01); *G01T 1/202* (2013.01); *G01T 1/2023* (2013.01);
(Continued)

(58) Field of Classification Search
CPC ... G01T 1/2018; G01T 1/202; G01T 1/2023; G21K 2004/10; G21K 4/00; H01L 27/14618; H01L 27/14663; H01L 2924/0002
See application file for complete search history.

(56) References Cited

U.S. PATENT DOCUMENTS 3,855,035 A    12/1974  Bates, Jr. et al.
7,034,306 B2 *  4/2006  Homme ................. G01T 1/202
                                                  250/368
(Continued)

FOREIGN PATENT DOCUMENTS

CN    101542635 A    9/2009
JP    2003-262671 A  9/2003
(Continued)

OTHER PUBLICATIONS

English-language translation of International Preliminary Report on Patentability (IPRP) dated Jan. 29, 2015 that issued in WO Patent Application No. PCT/JP2013/061514.

(Continued)

*Primary Examiner* — Mark R Gaworecki
(74) *Attorney, Agent, or Firm* — Drinker Biddle & Reath LLP (57) ABSTRACT

In a scintillator panel, a glass substrate with the thickness of not more than 150 μm serves as a support body, thereby achieving excellent radiotransparency and flexibility and also relieving a problem of thermal expansion coefficient. Furthermore, in this scintillator panel, an organic resin layer is formed so as to cover a one face side and a side face side of the glass substrate. This reinforces the glass substrate, whereby the edge part thereof can be prevented from chipping or cracking. Furthermore, stray light can be prevented from entering the side face of the glass substrate, while transparency is ensured for light incident to the other face side of the glass substrate because the organic resin layer is not formed on the other face side of the glass substrate.

8 Claims, 7 Drawing Sheets

(51) Int. Cl.
*G01T 1/202* (2006.01)
*G21K 4/00* (2006.01)

(52) U.S. Cl.
CPC .. *H01L 27/14618* (2013.01); *H01L 27/14663* (2013.01); *G21K 4/00* (2013.01); *G21K 2004/10* (2013.01); *H01L 2924/0002* (2013.01)

(56) References Cited

U.S. PATENT DOCUMENTS

| | | | |
|---|---|---|---|
| 7,164,137 B2* | 1/2007 | Hayashida | G01T 1/2018 250/370.11 |
| 7,618,511 B2 | 11/2009 | Sato et al. | |
| 2003/0001101 A1 | 1/2003 | Homme et al. | |
| 2005/0077480 A1* | 4/2005 | Kishinami | G21K 4/00 250/484.4 |
| 2006/0038131 A9 | 2/2006 | Homme et al. | |
| 2006/0038132 A1 | 2/2006 | Hayashida | |
| 2006/0263521 A1* | 11/2006 | Sato | G01T 1/2018 427/248.1 |
| 2008/0054181 A1* | 3/2008 | Kondo | G01T 1/202 250/361 R |
| 2010/0006762 A1* | 1/2010 | Yoshida | C09K 11/613 250/361 R |
| 2011/0147602 A1 | 6/2011 | Ishida et al. | |

FOREIGN PATENT DOCUMENTS

| | | |
|---|---|---|
| JP | 2005-114680 A | 4/2005 |
| JP | 2006-058124 A | 3/2006 |
| JP | 2007-279051 A | 10/2007 |
| WO | WO-2004079396 A1 | 9/2004 |
| WO | WO-2008/117821 A1 | 10/2008 |
| WO | WO-2009028275 A1 | 3/2009 |

OTHER PUBLICATIONS

Extended European Search Report issued Apr. 19, 2016 in European Patent Application No. 13819554.0.

* cited by examiner

SCINTILLATOR PANEL AND RADIATION DETECTOR

TECHNICAL FIELD

The present invention relates to a scintillator panel and a radiation detector.

BACKGROUND ART

As a conventional scintillator panel there is, for example, the one described in Patent Literature 1. In this conventional configuration, a 0.05-mm glass substrate is used as a support body for a scintillator layer. Furthermore, a buffer to relieve force from the outside of a housing and a high-stiffness member with stiffness higher than that of the scintillator layer are disposed between the housing and the scintillator layer.

In the scintillator panel described in Patent Literature 2, a graphite substrate coated with a polyimide-based resin film or with a poly-para-xylylene film is used as a support body. Furthermore, in the scintillator panel described in Patent Literature 3, the entire surface of the substrate comprised of amorphous carbon or the like is covered by an intermediate film such as a poly-para-xylylene film.

CITATION LIST

Patent Literatures

Patent Literature 1: Japanese Patent Application Laid-open Publication No. 2006-58124
Patent Literature 2: International Publication WO 2009/028275
Patent Literature 3: Japanese Patent Application Laid-open Publication No. 2007-279051

SUMMARY OF INVENTION

Technical Problems

The scintillator panel applied, for example, to a solid-state detector such as a thin-film transistor (TFT) panel is required to have flexibility enough to satisfy shape-following capability to the solid-state detector. In addition, if there is a difference between the coefficient of thermal expansion of the TFT panel and the coefficient of thermal expansion of the substrate of the scintillator panel, fine flaws on the substrate of the scintillator panel or flaws made between the scintillator panel and the TFT panel by abnormally grown portions produced in formation of the scintillator layer by evaporation can transfer to the light receiving surface because of heat during operation, raising a problem that effort of calibration becomes troublesome.

For solving the problem of flexibility and the problem of coefficient of thermal expansion as described above, it is conceivable to use extremely thin glass, e.g., in the thickness of not more than 150 μm as the substrate of the scintillator panel. However, when the extremely thin glass is used, there arises a problem that the end (edge part) of glass is brittle under an impact to chip or crack.

The present invention has been accomplished in order to solve the above problems and it is an object of the present invention to provide a scintillator panel capable of ensuring satisfactory flexibility while preventing the glass substrate from chipping or cracking, and a radiation detector using it.

Solution to Problems

In order to solve the above problems, a scintillator panel according to the present invention comprises: a glass substrate with a thickness of not more than 150 μm having radiotransparency; an organic resin layer formed so as to cover a one face side and a side face side of the glass substrate; a scintillator layer formed on the one face side of the glass substrate on which the organic resin layer is formed; and a moisture-resistant protection layer formed so as to cover the scintillator layer along with the glass substrate on which the organic resin layer is formed.

In this scintillator panel, the glass substrate with the thickness of not more than 150 μm serves as a support body, thereby to achieve excellent radiotransparency and flexibility and also relieve the problem of thermal expansion coefficient. In addition, in this scintillator panel the organic resin layer is formed so as to cover the one face side and the side face side of the glass substrate. This reinforces the glass substrate, whereby the edge part thereof can be prevented from chipping or cracking. Furthermore, stray light can be prevented from entering the side face of the glass substrate, while transparency is ensured for light incident to the other face side of the glass substrate because the organic resin layer is not formed on the other face side of the glass substrate.

Another scintillator panel according to the present invention comprises: a glass substrate with a thickness of not more than 150 μm having radiotransparency; an organic resin layer formed so as to cover an other face side and a side face side of the glass substrate; a scintillator layer formed on a one face side of the glass substrate on which the organic resin layer is formed; and a moisture-resistant protection layer formed so as to cover the scintillator layer along with the glass substrate on which the organic resin layer is formed.

In this scintillator panel, the glass substrate with the thickness of not more than 150 μm serves as a support body, thereby to achieve excellent radiotransparency and flexibility and also relieve the problem of thermal expansion coefficient. In addition, in this scintillator panel the organic resin layer is formed so as to cover the other face side and the side face side of the glass substrate. This reinforces the glass substrate, whereby the edge part thereof can be prevented from chipping or cracking. Furthermore, stray light can be prevented from entering the side face of the glass substrate and, since the organic resin layer is present on the other face side of the glass substrate, internal stress of the scintillator layer can be cancelled, so as to suppress warping of the glass substrate.

In the foregoing scintillator panel, the organic resin layer may be selected from silicone resin, urethane resin, epoxy resin, and fluorine resin.

Another scintillator panel according to the present invention comprises: a glass substrate with a thickness of not more than 150 μm having radiotransparency; a resin film layer stuck so as to cover a one face side of the glass substrate; a scintillator layer formed on the one face side of the glass substrate on which the resin film is stuck; and a moisture-resistant protection layer formed so as to cover the scintillator layer along with the glass substrate on which the the resin film is stuck.

In this scintillator panel, the glass substrate with the thickness of not more than 150 μm serves as a support body, thereby to achieve excellent radiotransparency and flexibility and also relieve the problem of thermal expansion coefficient. In addition, in this scintillator panel the resin film layer is formed so as to cover the one face side of the glass substrate. This reinforces the glass substrate, whereby the edge part thereof can be prevented from chipping or cracking. Furthermore, since the resin film layer is not formed on the other face side of the glass substrate, transparency is ensured for light incident to the other face side of the glass substrate.

Another scintillator panel according to the present invention comprises: a glass substrate with a thickness of not more than 150 μm having radiotransparency; a resin film layer stuck so as to cover an other face side of the glass substrate; a scintillator layer formed on a one face side of the glass substrate on which the resin film is stuck; and a moisture-resistant protection layer formed so as to cover the scintillator layer along with the glass substrate on which the resin film is stuck.

In this scintillator panel, the glass substrate with the thickness of not more than 150 μm serves as a support body, thereby to achieve excellent radiotransparency and flexibility and also relieve the problem of thermal expansion coefficient. In addition, in this scintillator panel the resin film layer is formed so as to cover the other face side of the glass substrate. This reinforces the glass substrate, whereby the edge part thereof can be prevented from chipping or cracking. Furthermore, since the resin film layer is present on the other face side of the glass substrate, internal stress of the scintillator layer can be cancelled, so as to suppress warping of the glass substrate.

Another scintillator panel according to the present invention comprises: a glass substrate with a thickness of not more than 150 μm having radiotransparency; a resin film layer stuck so as to cover a one face side and an other face side of the glass substrate; a scintillator layer formed on the one face side of the glass substrate on which the resin film is stuck; and a moisture-resistant protection layer formed so as to cover the scintillator layer along with the glass substrate on which the resin film is stuck.

In this scintillator panel, the glass substrate with the thickness of not more than 150 μm serves as a support body, thereby to achieve excellent radiotransparency and flexibility and also relieve the problem of thermal expansion coefficient. In addition, in this scintillator panel the resin film layer is formed so as to cover the one face side and the other face side of the glass substrate. This reinforces the glass substrate, whereby the edge part thereof can be more effectively prevented from chipping or cracking. Furthermore, since the resin film layer is formed on the one face side and on the other face side of the glass substrate, warping of the glass substrate can be suppressed.

In the foregoing scintillator panel, the resin film may be selected from PET, PEN, COP, and PI.

Another scintillator panel according to the present invention comprises: a glass substrate with a thickness of not more than 150 μm having radiotransparency; an organic resin layer formed so as to cover a one face side and a side face side of the glass substrate; a resin film layer stuck so as to cover an other face side of the glass substrate; a scintillator layer formed on the one face side of the glass substrate on which the organic resin layer and the resin film layer are formed; and a moisture-resistant protection layer formed so as to cover the scintillator layer along with the glass substrate on which the organic resin layer and the resin film layer are formed.

In this scintillator panel, the glass substrate with the thickness of not more than 150 μm serves as a support body, thereby to achieve excellent radiotransparency and flexibility and also relieve the problem of thermal expansion coefficient. In addition, in this scintillator panel the organic resin layer is formed so as to cover the one face side and the side face side of the glass substrate and the resin film layer is formed so as to cover the other face side of the glass substrate. This reinforces the glass substrate, whereby the edge part thereof can be prevented from chipping or cracking. Furthermore, stray light can be prevented from entering the side face of the glass substrate and, since at least one of the organic resin layer and the resin film layer is formed over the entire surface, warping of the glass substrate can be suppressed.

Another scintillator panel according to the present invention comprises: a glass substrate with a thickness of not more than 150 μm having radiotransparency; an organic resin layer formed so as to cover an other face side and a side face side of the glass substrate; a resin film layer stuck so as to cover a one face side of the glass substrate; a scintillator layer formed on the one face side of the glass substrate on which the organic resin layer and the resin film layer are formed; and a moisture-resistant protection layer formed so as to cover the scintillator layer along with the glass substrate on which the organic resin layer and the resin film layer are formed.

In this scintillator panel, the glass substrate with the thickness of not more than 150 μm serves as a support body, thereby to achieve excellent radiotransparency and flexibility and also relieve the problem of theimal expansion coefficient. In addition, in this scintillator panel the organic resin layer is formed so as to cover the other face side and the side face side of the glass substrate and the resin film layer is formed so as to cover the one face side of the glass substrate. This reinforces the glass substrate, whereby the edge part thereof can be prevented from chipping or cracking. Furthermore, stray light can be prevented from entering the side face of the glass substrate and, since at least one of the organic resin layer and the resin film layer is formed over the entire surface, warping of the glass substrate can be suppressed.

In the foregoing scintillator panel, the organic resin layer may be selected from silicone resin, urethane resin, epoxy resin, and fluorine resin and the resin film may be selected from PET, PEN, COP, and PI.

Furthermore, a radiation detector according to the present invention comprises: the scintillator panel as described above; and a light receiving element arranged opposite to the scintillator layer on which the protection layer is formed.

In this radiation detector, the glass substrate with the thickness of not more than 150 μm serves as a support body, thereby to achieve excellent radiotransparency and flexibility and also relieve the problem of thermal expansion coefficient. In addition, in this radiation detector the organic resin layer or the resin film layer reinforces the glass substrate, whereby the edge part thereof can be prevented from chipping or cracking.

Advantageous Effect of Invention

The present invention has made it feasible to ensure satisfactory flexibility while preventing the glass substrate from chipping or cracking.

DESCRIPTION OF EMBODIMENTS

Preferred embodiments of the scintillator panel and the radiation detector according to the present invention will be described below in detail with reference to the drawings.

[First Embodiment]

Figure 1:
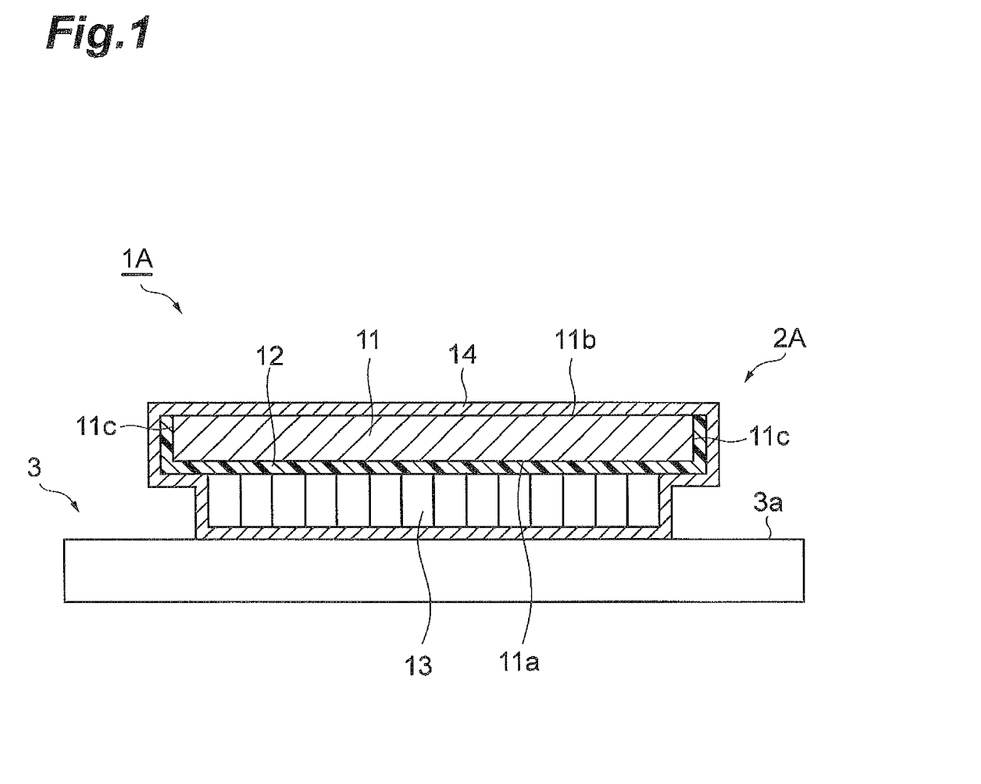
FIG. 1 is a cross-sectional view showing a configuration of a radiation detector according to the first embodiment of the present invention.

FIG. 1 is a cross-sectional view showing a configuration of a radiation detector according to the first embodiment of the present invention. As shown in the same drawing, the radiation detector 1A is constructed by fixing a light receiving element 3 to a scintillator panel 2A. The light receiving element 3 is, for example, a TFT panel in which photodiodes (PD) and thin-film transistors (TFT) are arrayed on a glass substrate.

The light receiving element 3 is stuck on a one face side of the scintillator panel 2A so that a light receiving surface 3a thereof is opposed to a below-described scintillator layer 13 in the scintillator panel 2A. The light receiving element 3 to be also used herein besides the TFT panel can be an element configured so that an image sensor such as CCD is connected through a fiber optic plate (FOP: an optical device composed of a bundle of several-micrometer optical fibers, e.g., J5734 available from Hamamatsu Photonics K.K.).

The scintillator panel 2A is composed of a glass substrate 11 as a support body, an organic resin layer 12 to protect the glass substrate 11, a scintillator layer 13 to convert incident radiation to visible light, and a moisture-resistant protection layer 14 to protect the scintillator layer 13 from moisture.

The glass substrate 11 is, for example, an extremely thin substrate having the thickness of not more than 150 µm and preferably having the thickness of not more than 100 µm. Since the glass substrate 11 is extremely thin in thickness, it has sufficient radiotransparency and flexibility and ensures satisfactory shape-following capability of the scintillator panel 2A in sticking it on the light receiving surface 3a of the light receiving element 3.

The organic resin layer 12 is formed, for example, of silicone resin, urethane resin, epoxy resin, fluorine resin, or the like so as to cover a one face 11a and a side face 11c of the glass substrate 11. A method for forming the organic resin layer 12 is, for example, coating by the spin coating method or the like. The thickness of the organic resin layer 12 is, for example, approximately 100 µm.

The scintillator layer 13 is formed on the one face 11a side of the glass substrate 11 on which the organic resin layer 12 is formed, for example, by growing and depositing columnar crystals of CsI doped with T1 by the evaporation method. The thickness of the scintillator layer 13 is, for example, 250 µm. The scintillator layer 13 is highly hygroscopic and could deliquesce with moisture in air if kept exposed to air. For this reason, the moisture-resistant protection layer 14 is needed for the scintillator layer 13.

The protection layer 14 is formed, for example, by growing poly-para-xylylene or the like by the vapor phase deposition such as the CVD method, so as to cover the scintillator layer 13 along with the glass substrate 11 on which the organic resin layer 12 is formed. The thickness of the protection layer 14 is, for example, approximately 10 µm.

In the radiation detector 1A having the configuration as described above, radiation incident from the glass substrate 11 side is converted to light in the scintillator layer 13 and the light is detected by the light receiving element 3. Since in the scintillator panel 2A the glass substrate 11 with the thickness of not more than 150 µm serves as a support body, it has excellent radiotransparency and flexibility.

The glass substrate 11 has sufficient flexibility, thereby satisfying the shape-following capability in sticking the scintillator panel 2A to the light receiving surface 3a of the light receiving element 3. Furthermore, when the TFT panel is used as the light receiving element 3 and when the light receiving surface 3a is a glass panel, the coefficient of thermal expansion of the light receiving surface 3a can be made equal to that of the glass substrate 11 of the scintillator panel 2A. This can prevent fine flaws on the glass substrate 11 or flaws made between the scintillator panel and the TFT panel by abnormally grown portions produced during formation of the scintillator layer 13 by evaporation, from transferring to the light receiving surface 3a because of heat during operation, and can also avoid the need for troublesome effort of calibration.

In addition, in this scintillator panel 2A the organic resin layer 12 is formed so as to cover the one face 11a and the side face 11c of the glass substrate 11. This reinforces the glass substrate 11, whereby the edge part thereof can be prevented from chipping or cracking. This also contributes to improvement in handling performance during manufacture and during use. Furthermore, stray light can be prevented from entering the side face 11c of the glass substrate 11 and the absence of the organic resin layer 12 on the other face 11b side of the glass substrate 11 ensures transparency for light incident to the other face 11b side of the glass substrate 11, so as to decrease reflection of light toward the light receiving element 3, with the result that resolution can be maintained.

Moreover, since the organic resin layer 12 is formed so as to cover the one face 11a and the side face 11c of the glass substrate 11, it also becomes possible to adjust the surface condition of the glass substrate 11 so as to achieve appropriate surface energy and surface roughness in formation of the scintillator layer 13.

[Second Embodiment]

Figure 2:
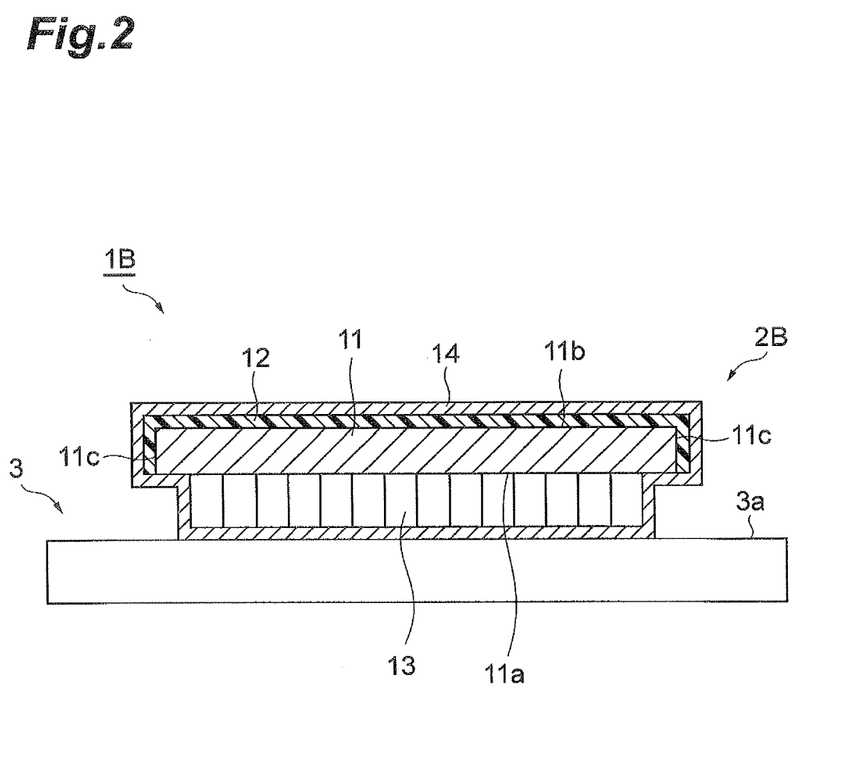
FIG. 2 is a cross-sectional view showing a configuration of a radiation detector according to the second embodiment of the present invention.

FIG. 2 is a cross-sectional view showing a configuration of a radiation detector according to the second embodiment of the present invention. As shown in the same drawing, the radiation detector 1B according to the second embodiment is different from the first embodiment in that in a scintillator panel 2B, the organic resin layer 12 is foinied so as to cover the other face 11b, instead of the one face 11a of the glass substrate 11.

In this configuration, just as in the above embodiment, the glass substrate 11 is also reinforced by the organic resin layer 12, whereby the edge part thereof can be prevented from chipping or cracking and whereby stray light can be prevented from entering the side face 11c of the glass substrate 11.

In addition, since the organic resin layer 12 is present on the other face 11b side of the glass substrate 11, internal stress of the scintillator layer 13 can be cancelled, so as to suppress warping of the glass substrate 11. The effect of suppressing warping of the glass substrate 11 becomes particularly prominent in a case where the glass substrate 11 is a small substrate of about 10 cm×10 cm.

[Third Embodiment]

Figure 3:
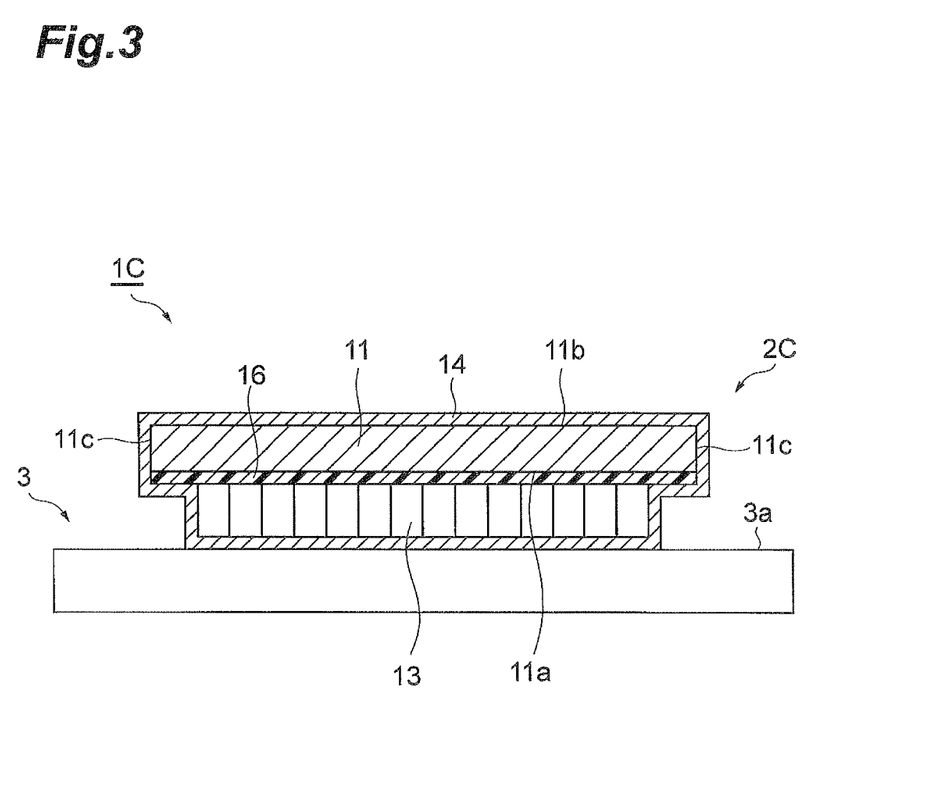
FIG. 3 is a cross-sectional view showing a configuration of a radiation detector according to the third embodiment of the present invention.

FIG. 3 is a cross-sectional view showing a configuration of a radiation detector according to the third embodiment of the present invention. As shown in the same drawing, the radiation detector 1C according to the third embodiment is different from the first embodiment in that in a scintillator panel 2C, instead of the organic resin layer 12, a resin film layer 16 is stuck so as to cover the one face 11a of the glass substrate 11 and the side face 11c is not covered by the organic resin layer 12.

More specifically, the resin film layer 16 is stuck on the surface (one face 11a) side where the scintillator layer 13 is formed, in the glass substrate 11 by means of a laminator or the like.

The resin film layer 16 to be used herein can be, for example, PET (polyethylene terephthalate), PEN (polyethylene naphthalate), COP (cycloolefin polymer), PT (polyimide), or the like. The thickness of the resin film layer 16 is, for example, approximately 100 μm. Furthermore, the edge of the resin film layer 16 is preferably coincident with the edge of the glass substrate 11 or slightly projects out therefrom.

In this configuration, the glass substrate 11 is also reinforced by the resin film layer 16, whereby the edge part thereof can be prevented from chipping or cracking, as in the above embodiments. In addition, since the resin film layer 16 is not formed on the other face 11b side of the glass substrate 11, the transparency is ensured for light incident to the other face 11b side of the glass substrate 11, so as to reduce reflection of light toward the light receiving element 3, with the result that the resolution can be maintained, as in the first embodiment, Moreover, since the resin film layer 16 is formed so as to cover the one face 11a of the glass substrate 11, it also becomes possible to adjust the surface condition of the glass substrate 11 so as to achieve appropriate surface energy and surface roughness in formation of the scintillator layer 13.

[Fourth Embodiment]

Figure 4:
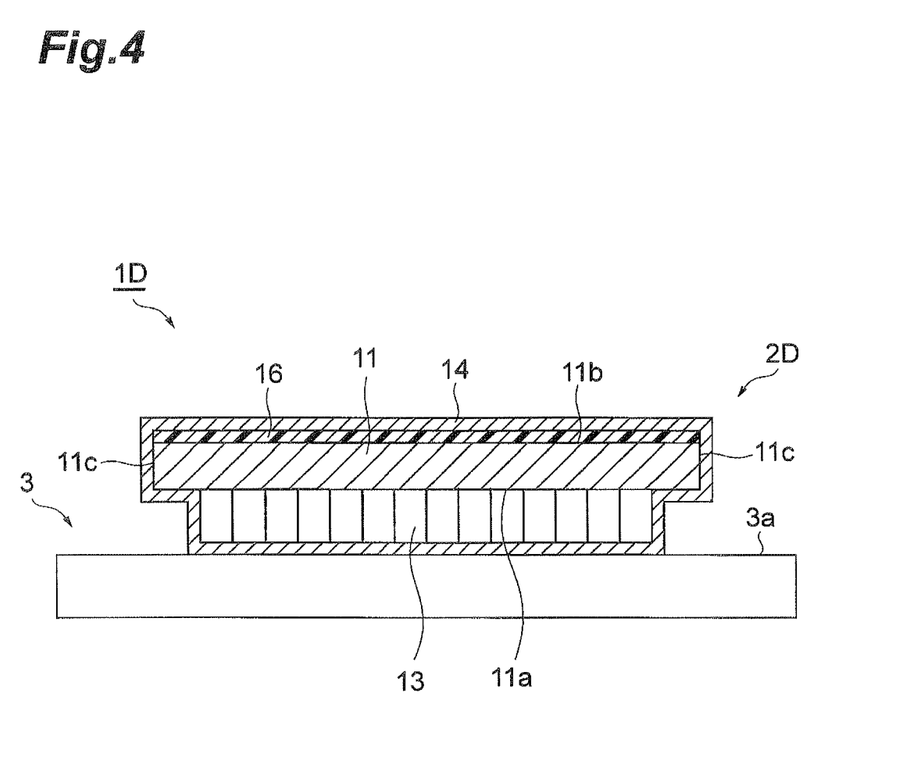
FIG. 4 is a cross-sectional view showing a configuration of a radiation detector according to the fourth embodiment of the present invention.

FIG. 4 is a cross-sectional view showing a configuration of a radiation detector according to the fourth embodiment of the present invention. As shown in the same drawing, the radiation detector 1D according to the fourth embodiment is different from the third embodiment in that in a scintillator panel 2D, the resin film layer 16 is stuck so as to cover the other face 11b, instead of the one face 11a of the glass substrate 11.

In this configuration, the glass substrate 11 is also reinforced by the resin film layer 16, whereby the edge part thereof can be prevented from chipping or cracking, as in the above embodiments. In addition, since the resin film layer 16 is present on the other face 11b side of the glass substrate 11, internal stress of the scintillator layer 13 can be cancelled, so as to suppress warping of the glass substrate 11, as in the second embodiment.

[Fifth Embodiment]

Figure 5:
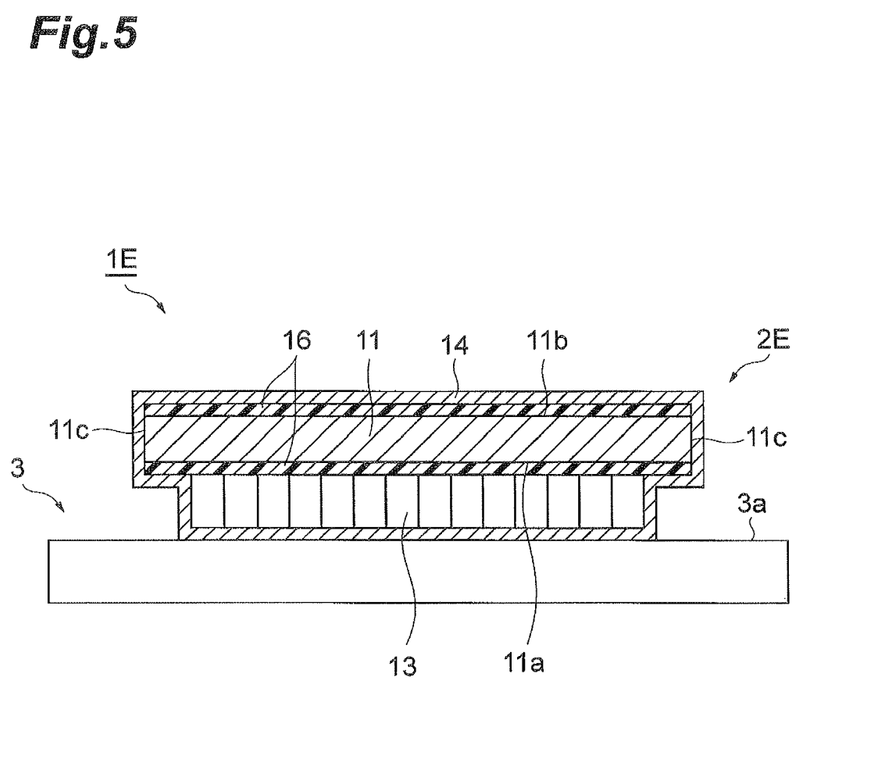
FIG. 5 is a cross-sectional view showing a configuration of a radiation detector according to the fifth embodiment of the present invention.

FIG. 5 is a cross-sectional view showing a configuration of a radiation detector according to the fifth embodiment of the present invention. As shown in the same drawing, the radiation detector 1E according to the fifth embodiment is different from the third embodiment and the fourth embodiment in that in a scintillator panel 2E, the resin film layer 16 is stuck so as to cover the both faces of the glass substrate 11.

In this configuration, both of the one face 11a and the other face 11b of the glass substrate 11 are reinforced by the resin film layer 16, whereby the edge part thereof can be more effectively prevented from chipping or cracking. In addition, the resin layer of the same material is formed on the one face 11a side and on the other face 11b side of the glass substrate 11, whereby warping of the glass substrate 11 can be suppressed.

Moreover, since the resin film layer 16 is formed so as to cover the one face 11a and the other face 11b of the glass substrate 11, it also becomes possible to adjust the surface condition of the glass substrate 11 so as to achieve appropriate surface energy and surface roughness in formation of the scintillator layer 13.

[Sixth Embodiment]

Figure 6:
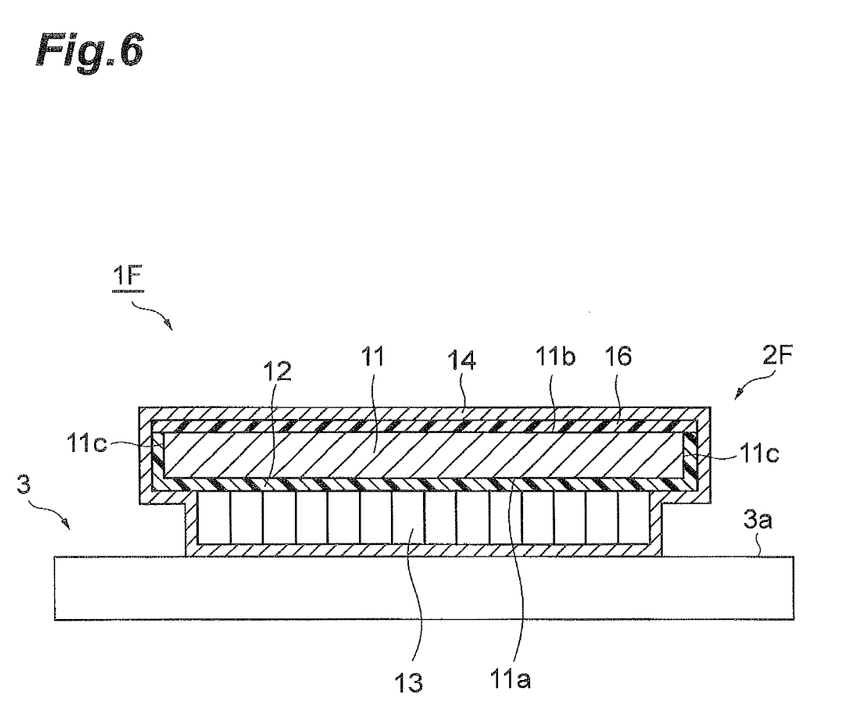
FIG. 6 is a cross-sectional view showing a configuration of a radiation detector according to the sixth embodiment of the present invention.

FIG. 6 is a cross-sectional view showing a configuration of a radiation detector according to the sixth embodiment of the present invention. As shown in the same drawing, the radiation detector 1F according to the sixth embodiment is different from the first embodiment in that in a scintillator panel 2F, the resin film layer 16 is added. More specifically, on the glass substrate 11 in which the organic resin layer 12 is formed so as to cover the one face 11a side and the side face 11c side, the resin film layer 16 is further stuck so as to cover the other face 11b side.

In this configuration, the entire surface of the glass substrate 11 is reinforced by the organic resin layer 12 and the resin film layer 16, whereby the edge part thereof can be more effectively prevented from chipping or cracking. Furthermore, just as in the first embodiment, the organic resin layer12 is formed so as to cover the side face 11c of the glass substrate 11, whereby stray light can be prevented from entering the side face 11c of the glass substrate 11. In addition, since the respective resin layers are formed on the one face 11a side and on the other face 11b side of the glass substrate 11, warping of the glass substrate 11 can be suppressed.

Moreover, since the organic resin layer 12 and the resin film layer 16 are formed so as to cover the entire surface of the glass substrate 11, it also becomes possible to adjust the surface condition of the glass substrate 11 so as to achieve appropriate surface energy and surface roughness in formation of the scintillator layer 13.

[Seventh Embodiment]

Figure 7:
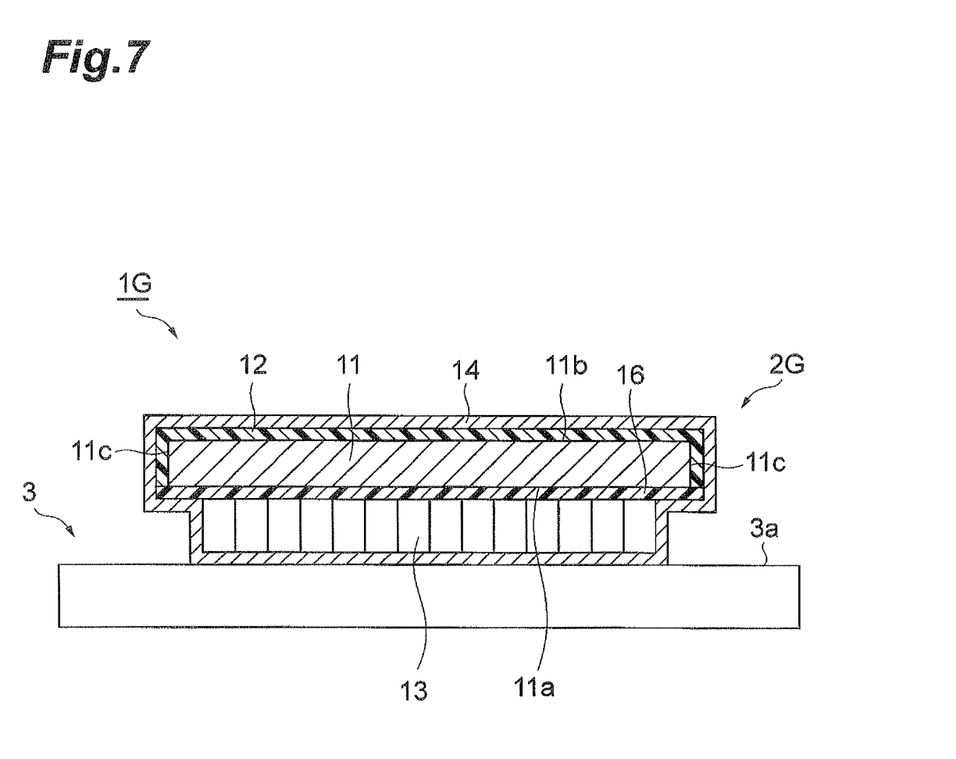
FIG. 7 is a cross-sectional view showing a configuration of a radiation detector according to the seventh embodiment of the present invention.

FIG. 7 is a cross-sectional view showing a configuration of a radiation detector according to the seventh embodiment of the present invention. As shown in the same drawing, the radiation detector 1G according to the seventh embodiment is different from the second embodiment in that in a scintillator panel 2G, the resin film layer 16 is added. More specifically, on the glass substrate 11 in which the organic resin layer 12 is formed so as to cover the other face 11b side and the side face 11c side, the resin film layer 16 is further stuck so as to cover the one face 11a side.

In this configuration, the entire surface of the glass substrate 11 is reinforced by the organic resin layer 12 and the resin film layer 16, whereby the edge part thereof can be more effectively prevented from chipping or cracking, as in the sixth embodiment. Furthermore, just as in the sixth embodiment, the organic resin layer12 is formed so as to cover the side face 11c of the glass substrate 11, whereby stray light can be prevented from entering the side face 11c of the glass substrate 11; since the respective resin layers are formed on the one face 11a side and on the other face 11b side of the glass substrate 11, warping of the glass substrate 11 can be suppressed.

Moreover, since the organic resin layer 12 and the resin film layer 16 are formed so as to cover the entire surface of the glass substrate 11, it also becomes possible to adjust the surface condition of the glass substrate 11 so as to achieve appropriate surface energy and surface roughness in formation of the scintillator layer 13.

REFERENCE SIGNS LIST 1A-1G radiation detectors; 2A-2G scintillator panels; 3 light receiving element; 11 glass substrate; 11a one face; 11b other face; 11c side face; 12 organic resin layer; 13 scintillator layer; 14 protection layer; 16 resin film layer.

The invention claimed is:

1. A scintillator panel comprising:
a glass substrate with a thickness of not more than 150 µm having radiotransparency;
an organic resin layer formed by coating a one face side and a side face side of the glass substrate;
a resin film layer stuck so as to cover an other face side of the glass substrate;
a scintillator layer formed on the one face side of the glass substrate on which the organic resin layer and the resin film layer are formed; and
a moisture-resistant protection layer comprising polyparaxylylene and formed so as to cover the scintillator layer along with the glass substrate on which the organic resin layer and the resin film layer are formed,
wherein the organic resin layer, the resin film layer, and the protection layer are formed of materials different from each other.

2. The scintillator panel according to claim 1, wherein the organic resin layer is selected from silicone resin, urethane resin, epoxy resin, and fluorine resin and wherein the resin film is selected from PET, PEN, COP, and PI.

3. A radiation detector comprising:
the scintillator panel as set forth in claim 1; and
a light receiving element comprising a thin-film transistor (TFT) panel in which photodiodes and the TFT are arrayed on a glass substrate of the TFT panel, the light receiving element facing the one side of the glass substrate, wherein the scintillator layer is disposed between the light receiving element and the glass substrate on which the protection layer is formed.

4. A scintillator panel comprising:
a glass substrate with a thickness of not more than 150 µm having radiotransparency and having a one face side, an other face side, and a side face side;
an organic resin layer formed by coating the other face side and the side face side of the glass substrate;
a resin film layer stuck so as to cover the one face side of the glass substrate;
a scintillator layer formed on the one face side of the glass substrate on which the organic resin layer and the resin film layer are formed; and
a moisture-resistant protection layer comprising polyparaxylylene and formed so as to cover the scintillator layer along with the glass substrate on which the organic resin layer and the resin film layer are formed,
wherein the organic resin layer, the resin film layer, and the protection layer are formed of materials different from each other.

5. The scintillator panel according to claim 4, wherein the organic resin layer is selected from silicone resin, urethane resin, epoxy resin, and fluorine resin and wherein the resin film is selected from PET, PEN, COP, and PI.

6. A radiation detector comprising:
the scintillator panel as set forth in claim 4; and
a light receiving element comprising a thin-film transistor (TFT) panel in which photodiodes and the TFT are arrayed on a glass substrate of the TFT panel, the light receiving element facing the one side of the glass substrate, wherein the scintillator layer is disposed between the light receiving element and the glass substrate on which the protection layer is formed.

7. A method of producing a scintillator panel, comprising:
forming an organic resin layer by coating a one face side and a side face side of a glass substrate with a thickness of not more than 150 µm;
depositing a scintillator layer comprised of columnar crystals onto the organic resin layer formed on the one face side of the glass substrate; and
forming a moisture-resistant protection layer comprising polyparaxylylene that covers the organic resin layer and the scintillator layer,
wherein the organic resin layer, a resin film layer, and the protection layer are formed of materials different from each other.

8. The method of producing a scintillator panel according to claim 7, further comprising sticking an organic film layer onto an other face side and the side face side of the glass substrate.

* * * * *